United States Patent
Sugimoto et al.

(10) Patent No.: US 7,777,252 B2
(45) Date of Patent: Aug. 17, 2010

(54) III-V HEMT DEVICES

(75) Inventors: Masahiro Sugimoto, Toyota (JP); Tetsu Kachi, Nisshin (JP); Yoshitaka Nakano, Owariasahi (JP); Tsutomu Uesugi, Seto (JP); Hiroyuki Ueda, Kasugai (JP); Narumasa Soejima, Seto (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 494 days.

(21) Appl. No.: 11/632,665

(22) PCT Filed: Jun. 22, 2005

(86) PCT No.: PCT/JP2005/011891

§ 371 (c)(1), (2), (4) Date: Jan. 17, 2007

(87) PCT Pub. No.: WO2006/008925

PCT Pub. Date: Jan. 26, 2006

(65) Prior Publication Data

US 2008/0073652 A1 Mar. 27, 2008

(30) Foreign Application Priority Data

Jul. 20, 2004 (JP) ............................. 2004-210989

(51) Int. Cl.
*H01L 29/739* (2006.01)
*H01L 31/072* (2006.01)

(52) U.S. Cl. ........................................ 257/194; 257/192

(58) Field of Classification Search .................. 257/192, 257/194, 200, 201, E29.246, E29.247, E29.248, 257/E29.249, E29.252
See application file for complete search history.

(56) References Cited

U.S. PATENT DOCUMENTS

| 6,835,969 | B1 * | 12/2004 | Marsh et al. | ................. 257/197 |
| 7,550,783 | B2 * | 6/2009 | Wu et al. | ..................... 257/194 |
| 7,566,918 | B2 * | 7/2009 | Wu et al. | ..................... 257/194 |
| 2003/0173578 | A1 | 9/2003 | Schaff et al. | |

FOREIGN PATENT DOCUMENTS

JP     5-47800     2/1993

(Continued)

OTHER PUBLICATIONS

Yan-Kuin Su et al., "Flicker Noise of GaN-Based Heterostructure Field-Effect Transistors With Si-Doped AlGaN Carrier Injection Layer," *IEEE Electron Device Ltrs.*, vol. 24, No. 10, Oct. 2003.

(Continued)

*Primary Examiner*—Hung Vu
(74) *Attorney, Agent, or Firm*—Finnegan, Henderson, Farabow, Garrett & Dunner, LLP

(57) ABSTRACT

A semiconductor device has a stacked structure in which a p-GaN layer, an SI-GaN layer, and an AlGaN layer are stacked, and has a gate electrode that is formed at a top surface side of the AlGaN layer. A band gap of the AlGaN layer is wider than a band gap of the p-GaN layer and the SI-GaN layer. Moreover, impurity concentration of the SI-GaN layer is less than $1 \times 10^{17}$ cm$^{-3}$. Semiconductor devices including III-V semiconductors may have a stable normally-off operation.

4 Claims, 7 Drawing Sheets

FOREIGN PATENT DOCUMENTS

| | | |
|---|---|---|
| JP | 2003-59946 | 2/2003 |
| WO | WO 01/57929 | 8/2001 |

OTHER PUBLICATIONS

International Search Report.
Written Opinion of International Searching Authority.

European Office Action dated Sep. 29, 2009 for Application No. EP 05 755 884.3.
Office Action for Chinese Application No. 200580024191.4 dated Jun. 27, 2008.

* cited by examiner

FIG. 4
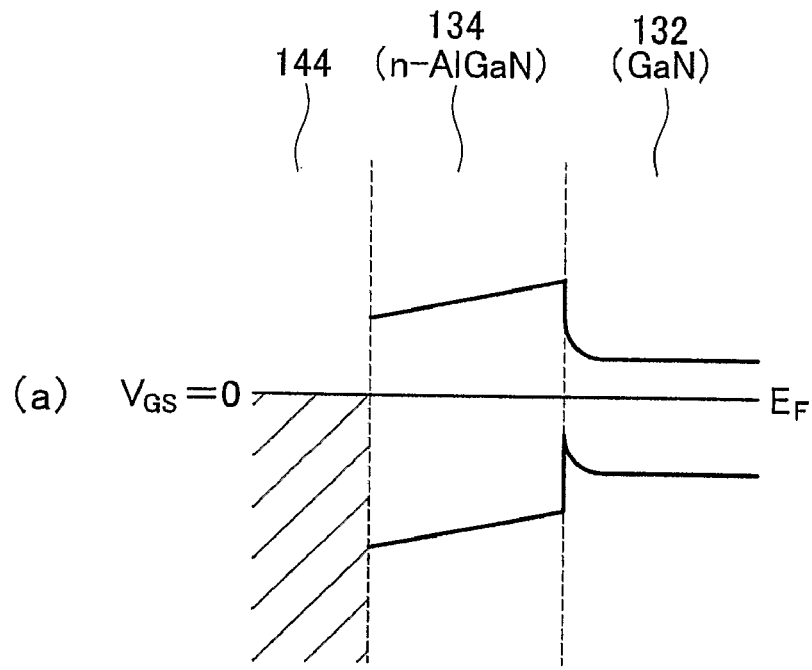
(a) $V_{GS}=0$
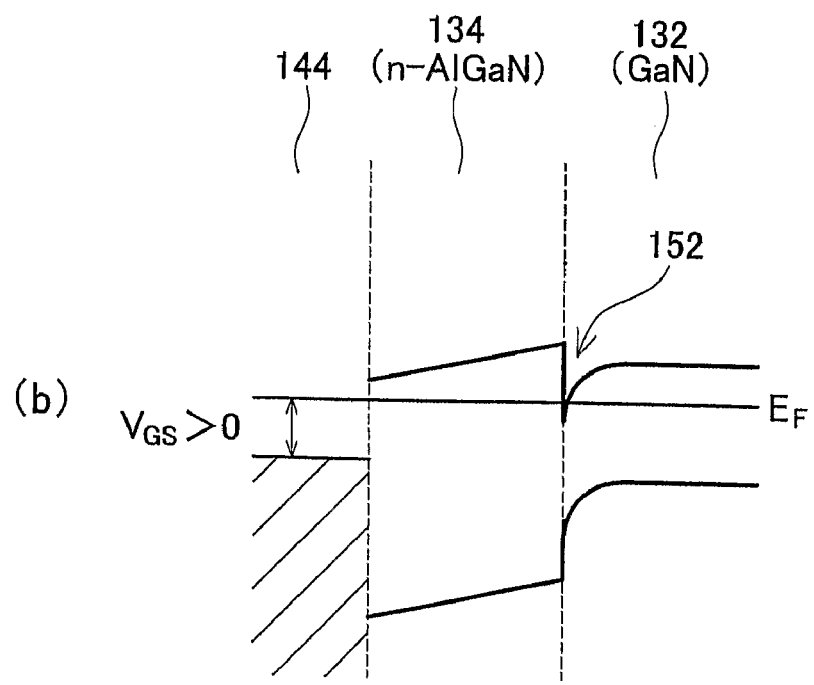
(b) $V_{GS}>0$
(n-AlGaN)

III-V HEMT DEVICES

The present application claims priority to Japanese Patent Application 2004-210989 filed on Jul. 20, 2004, the contents of which are hereby incorporated by reference.

TECHNICAL FIELD

This invention relates to normally-off type semiconductor devices comprising m-V semiconductors.

BACKGROUND ART

Since III-V semiconductors have a high breakdown field and a high saturated electron mobility, it is expected that semiconductor devices comprising III-V semiconductors will have a high breakdown voltage and will control large currents. Current research includes research on semiconductor devices that have a heterostructure comprising gallium nitride (GaN), an example of which is disclosed in Japanese Laid-Open Patent Application Publication No. 2003-59946.

One of this type of semiconductor devices is an HEMT (High Electron Mobility Transistor) having a heterostructure comprising a p-GaN layer, and an n-AlGaN layer stacked on a top surface of the p-GaN layer. Since aluminum (Al) is contained in semiconducting crystals of the n-AlGaN layer, a band gap of this layer is wider than the p-GaN layer. A drain electrode, a gate electrode, and a source electrode are formed at a top surface of the n-AlGaN layer. The gate electrode is formed between the drain electrode and the source electrode.

In this type of HEMT, a potential well is formed by the p-GaN layer and the n-AlGaN layer at their junction, however, an energy level of conduction band of the potential well is above the Fermi level unless a positive gate voltage is not applied to the gate electrode. Consequently 2DEG (2 Dimensional Electron Gas) is not generated in the potential well while the gate voltage is not being applied to the gate electrode. As a result, normally-off operation of the HEMT is possible. While a predetermined on-voltage is applied to the gate electrode, the energy level of conduction band of the potential well becomes lower than the Fermi level, and the 2DEG is generated in the potential well. Since electrons in the 2DEG move within the potential well, electric currents flow between the drain electrode to the source electrode while the predetermined gate voltage is being applied to the gate electrode of HEMT.

DISCLOSURE OF INVENTION

However, in the semiconductor device described above, there is a problem that electrons in the 2DEG move within the p-GaN layer. These moving electrons are scattered by impurities within the p-GaN layer, and on-resistance increases. The on-resistance here means a magnitude of resistance between the drain electrode and the source electrode while the predetermined gate voltage is applied to the gate electrode of HEMT.

A countermeasure has been considered of reducing impurity concentration in the p-GaN layer so as to reduce the on-resistance. However, if the impurity concentration in the p-GaN layer is reduced, the energy level of the potential well could approach the Fermi level while the gate voltage is not being applied to the gate electrode, and the 2DEG could readily be generated while the gate voltage is not being applied to the gate electrode. Normally-off operation of HEMT would thus be unstable. That is, in the semiconductor device comprising the aforementioned structure, there is a tradeoff between reducing the on-resistance and ensuring stable normally-off operation.

The present invention aims to overcome this tradeoff. That is, it aims to present semiconductor devices in which stable normally-off operation can be guaranteed, and in which the on-resistance can be decreased.

One of the semiconductor devices of the present invention has a first layer, a middle layer stacked on a top surface of the first layer, a second layer stacked on a top surface of the middle layer, and an electrode formed at a top surface side of the second layer. The first layer comprises a first III-V semiconductor having a first conductivity type, the middle layer comprises the first III-V semiconductor having impurity concentration of less than $1\times10^{17}$ cm$^{-3}$, and the second layer comprises a second III-V semiconductor having a second conductivity type or a substantially non-conductivity type. A band gap of the second III-V semiconductor is wider than a band gap of the first III-V semiconductor.

The middle layer and the second layer form a heterojunction. The electrode formed at a top surface side of the second layer may be, for example, a gate electrode. The gate electrode may be formed directly on the top surface of the second layer by using a Schottky contact. The gate electrode may be formed indirectly on the top surface of the second layer via an insulating material. The semiconductor device may further comprise a source electrode and/or a drain electrode. When the semiconductor device of the present invention is a lateral type semiconductor device, the source electrode and the drain electrode may be electrically connected with the second layer. The source electrode and the drain electrode are not restricted to being formed directly on the top surface of the second layer. When the semiconductor device of the present invention is a vertical type semiconductor device, the source electrode may be electrically connected with the second layer and the drain electrode may be electrically connected with a bottom surface of a semiconductor substrate.

The second layer may be formed from an intrinsic semiconducting layer that contains substantially no impurities (typically, impurity concentration is less than $1\times10^{17}$ cm$^{-3}$). In that case, the second layer may be a semi-insulating type. Alternatively, the second layer may be formed from semiconducting layer that contains second conductivity type impurities, this being an opposite conductivity type to the first conductivity type. In that case, the second layer is a second conductivity type. The second layer may be any conductivity type other than the first conductivity type, i.e. either the second conductivity type or the semi-insulating type.

In the semiconductor device described above, an energy level of a potential well formed by the first layer and the second layer at their junction is above the Fermi level while voltage is not applied to the electrode at the top surface side of the second layer. As a result, 2DEG is not generated in the potential well, and normally-off operation is ensured. By contrast, while a predetermined on-voltage is applied to the electrode, the energy level of the potential well formed by the first layer and the second layer becomes below the Fermi level, and consequently 2DEG is generated in the potential well.

In the semiconductor device of the present invention, the majority of the 2DEG is generated in the middle layer. Since the impurity concentration of the middle layer is less than $1\times10^{17}$ cm$^{-3}$, there is a great reduction in the extent to which electrons of the 2DEG moving within the potential well are scattered by impurities. As a result, on-resistance can be reduced further than in the case where a middle layer is not provided between the first layer and the second layer.

With the semiconductor device of the present invention, both stable normally-off operation and low on-resistance can be obtained.

It is preferred that the middle layer is formed within the potential well that is formed by the first layer and the second layer.

When the above relationship is fulfilled, the 2DEG is mainly generated in the middle layer while the predetermined on-voltage is applied to the electrode. As a result, most of the electrons of the 2DEG move within the middle layer, and consequently the probability of the 2DEG electrons being scattered by impurities can be greatly reduced. It is consequently possible to markedly reduce the on-resistance.

It is preferred that another semiconductor device of the present invention has a first layer, a second layer stacked on a top surface of the first layer, and an electrode formed at a top surface side of the second layer.

The first layer comprises a first III-V semiconductor. The second layer comprises a second III-V semiconductor. A band gap of the second III-V semiconductor is wider than a band gap of the first III-V semiconductor. There is no particular restriction on the conductivity types of the first layer and the second layer.

The semiconductor device has a characteristic that an electric field generated by piezoelectric polarization in the second layer has a direction opposite to a direction of an electric field generated by spontaneous polarization in the second layer.

In the aforementioned semiconductor device, heterojunction in which the band gaps of the first layer and the second layer differ is formed. Distortion occurs in the second layer due to lattice misfit with the first layer. A piezoelectric polarization is generated at a location where elastic stress is generated by this distortion, causing piezoelectric field in the second layer. The direction of piezoelectric field is determined by the materials used in the second layer and by the distortion occurring between the first layer and the second layer.

The spontaneous polarization is polarization generated by uneven charge distribution caused by the positive and negative ions in the semiconducting crystals in the second layer. The direction of spontaneous polarization is determined by the polarity of the second layer at a junction between the first layer and the second layer, and by the materials used in the second layer.

In the present invention, the above conditions are adjusted so that the electric field generated by piezoelectric polarization and the electric field generated by spontaneous polarization, which are both generated in the second layer, are in opposite directions. When these two electric fields are in opposite directions, the two offset one another, and the magnitude becomes smaller of a total electric field obtained by adding the vectors of the two electric fields.

In this type of semiconductor device, the electric field generated by piezoelectric polarization and the electric field generated by spontaneous polarization are generated in the second layer. The generation of 2DEG at the junction between the second layer and the first layer is influenced by the direction of the total electric field.

When the electric field generated by polarization in the second layer (this refers to the total electric field obtained by adding the vectors of the electric field generated by piezoelectric polarization and the electric field generated by spontaneous polarization) is small, it is possible to suppress the phenomenon whereby carriers are supplied to the vicinity of the junction between the first layer and the second layer when on-voltage is not being applied to the gate electrode. As a result, it is possible to suppress the phenomenon whereby the 2DEG is generated in the vicinity of the junction between the first layer and the second layer while on-voltage is not applied to the gate electrode. That is, it is easier to stable normally-off operation.

In conventional semiconductor devices of this type, both the electric field generated by piezoelectric polarization and the electric field generated by spontaneous polarization are directed towards the junction between the first layer and the second layer, and the total electric field, when the vectors of both fields have been added, is large. As a result, the phenomenon is strong whereby carriers are supplied from within the second layer to the vicinity of the junction between the first layer and the second layer when on-voltage is not being applied to the gate electrode. Consequently, 2DEG is readily generated in the vicinity of the junction between the first layer and the second layer while on-voltage is not applied to the gate electrode. Therefore, it was not possible to reduce the impurity concentration in the first layer in order to stabilize normally-off operation.

In the semiconductor device of the present invention, the electric field generated by piezoelectric polarization and the electric field generated by spontaneous polarization offset one another, and it is consequently possible to suppress the phenomenon whereby carriers are supplied from within the second layer to the vicinity of the junction. As a result, normally-off operation can be ensured even when the impurity concentration in the first layer is reduced. It is therefore also possible to reduce the on-resistance by reducing the impurity concentration in the first layer.

The above advantage can be ensured further if the direction of total electric field generated by both polarizations in the second layer extends from a junction between the first layer and the second layer.

The electric field due to piezoelectric polarization generated by the heterojunction of the first layer and second layer is directed towards the heterojunction. By contrast, the electric field generated by spontaneous polarization can be altered by the polarity of the second layer at this heterojunction, and can be adjusted so as to be directed away from this junction. As a result, as long as the electric field generated by spontaneous polarization is larger than the electric field generated by piezoelectric polarization, the total electric field of the second layer can be adjusted so as to be directed away from the junction.

If the electric field generated by piezoelectric polarization and the electric field generated by spontaneous polarization, these both being within the second layer, are generated in opposite directions, it is possible—as long as the electric field generated by spontaneous polarization is larger than the electric field generated by piezoelectric polarization—to adjust the total electric field of the second layer such that it extends from the junction.

In this case, also, the electric field generated by piezoelectric polarization and the electric field generated by spontaneous polarization offset one another, and consequently the total electric field comprising the sum of their vectors, is smaller. As a result, the phenomenon is suppressed whereby carriers are supplied from within the second layer to the vicinity of the junction. It is consequently no longer necessary to maintain a high impurity concentration in the first layer so as to stabilize normally-off operation. Both stable normally-off operation and low on-resistance can be obtained.

From another viewpoint, in the semiconductor device described above, the first layer has V group polarity at a junction between the first layer and the second layer, and the second layer has III group polarity at the junction.

When the polarity of the first layer at the junction is V group, the polarity of the second layer to be formed on the first layer will begin from III group. Consequently, the electric field generated in the second layer by spontaneous polarization can be directed away from the junction. By this means, the electric field generated by piezoelectric polarization that is directed towards the junction, and the electric field generated by spontaneous polarization that extends from the junction, offset one another, and it is therefore easy to realize stable normally-off operation. It is consequently no longer necessary to maintain a high impurity concentration in the first layer so as to stabilize normally-off operation. Both stable normally-off operation and low on-resistance can be obtained.

Another semiconductor device of the present invention comprises a first layer, a second layer stacked on a top surface of the first layer, a surface layer stacked on a top surface of the second layer, and an electrode formed at a top surface side of the surface layer.

The first layer comprises a first III-V semiconductor. The second layer comprises a second III-V semiconductor having a second conductivity type. The surface layer comprises an III-V semiconductor having a first conductivity type. A band gap of the second III-V semiconductor is wider than a band gap of the first III-V semiconductor.

The first layer may be a layer comprising an intrinsic semiconducting layer that contains essentially no impurities. Alternatively, the first layer may be a layer containing either first conductivity type or second conductivity type impurities. It is preferred that the surface layer comprises a second III-V semiconductor. This can reduce the generation of distortion caused by lattice unconformity between the second layer and the surface layer.

With the above semiconductor device, when on-voltage is not being applied to the electrode, a depleted layer extends towards the second layer from a junction between the second layer having the second conductivity type and the surface layer having the first conductivity type. By this means, the second layer and the surface layer are essentially depleted, and this prevents the phenomenon whereby carriers are supplied from the second layer towards a potential well formed by the first layer and the second layer. It is therefore easy to realize stable normally-off operation. As a result, it is no longer necessary to maintain a high impurity concentration in the first layer so as to stabilize normally-off operation. Both stable normally-off operation and low on-resistance can be obtained.

The technique of depleting the second layer and the surface layer by stacking the second layer having the second conductivity type and the surface layer having the first conductivity type, and thus suppressing the supply of carriers to the potential well, is also of use in a case where a plurality of stacks are repeated.

A semiconductor device in which this concept has been adopted comprises a first layer, a plurality of units of layers, and an electrode formed at a top surface side of the uppermost unit of layers. Each of the units of layers comprises a second layer and an upper layer stacked on a top surface of the second layer. Each of the units of layers is stacked on a top surface of a lower unit of layers.

The upper layer is equivalent to the surface layer in the semiconductor device described above. The second layer is stacked on the surface layer when the second layer and the surface layer are stacked a plurality of times, and consequently the term 'surface' is no longer appropriate. As a result, although the surface layer described above is actually repeated, it is referred to here as the upper layer (referring to its being above the second layer) so as to distinguish it from the aforementioned surface layer.

The first layer comprises a first III-V semiconductor. The second layer comprises a second III-V semiconductor having a second conductivity type. The upper layer comprises a III-V semiconductor having a first conductivity type. A band gap of the second III-V semiconductor is wider than a band gap of the first III-V semiconductor. It is preferred that the upper layer comprises the second III-V semiconductor. This can reduce the generation of distortion caused by lattice unconformity between the second layer and the upper layer.

As long as these are two or more, there is no particular restriction on the number of times the units of layers are repeatedly stacked. An uppermost face of the stacked unit of layers may be either the second layer or the upper layer. The impurity concentration, and the thickness of the second layer and the upper layer within the stacked structure may mutually differ. In short, layers of the first conductivity type (upper layers) and the second conductivity type (second layers) are stacked.

In this semiconductor device, the second layers and the upper layers are substantially depleted fully due to depleted layers extending both in the second layer and the upper layer from a junction between the second layer and the upper layer, and consequently carriers are not supplied towards a potential well formed by the first layer and the second layer. It is therefore easy to realize stable normally-off operation. As a result, it is no longer necessary to maintain a high impurity concentration in the first layer so as to stabilize normally-off operation. Both stable normally-off operation and low on-resistance can be obtained.

A new method for manufacturing the new semiconductor device has also been created in the present invention.

One manufacturing method of the present invention is suitable for manufacturing a semiconductor device having a first layer, a middle layer stacked on a top surface of the first layer, a second layer stacked on a top surface of the middle layer, and an electrode formed at a top surface side of the second layer.

The manufacturing method comprises a step of growing the middle layer on the top surface of the first layer by epitaxial growth under conditions wherein an impurity supply rate is controlled such that impurity concentration of the middle layer is maintained to be less than $1 \times 10^{17}$ cm$^{-3}$, a step of growing the second layer on the top surface of the middle layer by epitaxial growth, and a step of forming the electrode at the top surface side of the second layer. The first layer comprises a first III-V semiconductor having a first conductivity type, the middle layer comprises the first III-V semiconductor, and the second layer comprises a second III-V semiconductor having a second conductivity type or a substantially semi-insulating type. A band gap of the second III-V semiconductor is wider than a band gap of the first III-V semiconductor.

The phrase 'growing the middle layer by epitaxial growth under conditions wherein an impurity supply rate is controlled' refers to epitaxial growth where absolutely no impurities are supplied, or to epitaxial growth where the diffusion of impurities from the first layer or the second layer is taken into consideration, and where consequently the impurity supply rate or the thickness of the middle layer is controlled such that the impurity concentration of the middle layer will be less than $1 \times 10^{17}$ cm$^{-3}$.

Adopting the above manufacturing method allows the semiconductor device to be obtained in which the first layer, the middle layer, and the second layer are stacked, and in which the electrodes are formed directly or indirectly on the second layer. Stable normally-off operation is realized in this semiconductor device, and its on-resistance is low.

In the step of growing the middle layer, it is preferred that growth is controlled such that the middle layer is formed within the potential well that is formed by the first layer and the second layer. In other words, the middle layer is formed by epitaxial growth such that the layer thickness of the middle layer is smaller than the width of the potential well formed by the first layer and the second layer.

When the above relation is fulfilled, a semiconductor device with drastically reduced on-resistance can be obtained.

Another manufacturing method of the present invention can be applied to manufacture a semiconductor device having a first layer, a second layer stacked on a top surface of the first layer, and an electrode formed at a top surface side of the second layer.

The manufacturing method comprises a step of growing the second layer on the top surface of the first layer by epitaxial growth, and a step of forming the electrode at the top surface side of the second layer. The first layer comprises a first III-V semiconductor, and the top surface of the first layer has V group polarity. A band gap of the second III-V semiconductor is wider than a band gap of the first III-V semiconductor.

In the above manufacturing method, the first layer having V group polarity on its top surface is prepared. When the second layer is formed on the top surface of the first layer by epitaxial growth, crystal growth of the second layer begins from the III group. As a result, an electric field generated by spontaneous polarization within the second layer extends from a junction between the first layer and the second layer. A semiconductor device can therefore be obtained in which an electric field generated by piezoelectric polarization in the second layer is canceled by the electric field generated by spontaneous polarization within the second layer. In a semiconductor device manufactured by the above method, there is no need to maintain a high impurity concentration in the first layer in order to stabilize normally-off operation.

Yet another manufacturing method of the present invention is suitable for manufacturing a semiconductor device having a first layer, a second layer stacked on a top surface of the first layer, a surface layer stacked on a top surface of the second layer, and an electrode formed at a top surface side of the surface layer.

The manufacturing method comprises a step of growing the second layer on the top surface of the first layer by epitaxial growth, and a step of growing the surface layer on the top surface of the second layer by epitaxial growth. The first layer comprises a first III-V semiconductor, the second layer comprises a second III-V semiconductor having a second conductivity type, and the surface layer comprises an III-V semiconductor having a first conductivity type. A band gap of the second III-V semiconductor is wider than a band gap of the first III-V semiconductor.

When a semiconductor device is manufactured using the above method, the semiconductor device can be obtained in which a depleted layer extends into the second layer from the surface layer, and in which normally-off operation is consequently realized.

The technique of depleting the second layer and the surface layer by means of stacking the second layer having the second conductivity type and the surface layer having the first conductivity type is also of use in the case where such stacking is repeated for a predetermined cycle. In the case of manufacturing a semiconductor device having a first layer, a plurality of units of layers, and an electrode formed at a top surface side of the uppermost unit of layers, wherein each of the units of layers comprises a second layer and an upper layer stacked on a top surface of the second layer, and each of the units of layers is stacked on a top surface of a lower unit of layers, a step is performed of preparing the first layer by epitaxial growth. Further a step is performed of growing the second layer on the top surface of the first layer by epitaxial growth. Furthermore, a step is performed of growing the upper layer on a top surface of the second layer by epitaxial growth. The first layer comprises a first III-V semiconductor, the second layer comprises a second III-V semiconductor having a second conductivity type, and the upper layer comprises an III-V semiconductor having a first conductivity type.

Next, the following steps are performed: a step (step c) of growing the second layer on a top surface of the upper layer by epitaxial growth, and a step (step d) of growing the upper layer on a top surface of the second layer by epitaxial growth. The steps (c) and (d) are repeated for a predetermined cycle. Then, a step is performed of forming the electrode at a top surface side of the last layer formed. A band gap of the second III-V semiconductor is wider than a band gap of the first III-V semiconductor.

In the case where the joining of the second layer and the upper layer is repeated a plurality of times by repeating epitaxial growth, it is possible to omit the epitaxial growth of the upper layer during the final repetition. In that case, the second layer is the uppermost face.

In a semiconductor manufactured by the above method, it is easy to realize normally-off operation by depleting the upper layer and the second layer. It is consequently no longer necessary to maintain a high impurity concentration in the first layer so as to ensure stable normally-off operation, and a semiconductor device can be manufactured in which both stable normally-off operation and low on-resistance can be obtained.

In the semiconductor devices of the present invention, it is no longer necessary to maintain a high impurity concentration in a carrier movement region of the III-V semiconductor so as to ensure stable normally-off operation, and both stable normally-off operation and low on-resistance can be obtained.

BRIEF DESCRIPTION OF DRAWINGS

FIG. 2(a) shows an energy band when the semiconductor device of the first embodiment is off.

FIG. 2(b) shows an energy band when the semiconductor device of the first embodiment is on.

FIG. 4(a) shows an energy band when the semiconductor device of the second embodiment is off.

FIG. 4(b) shows an energy band when the semiconductor device of the second embodiment is on.

FIG. 6(a) shows an energy band when the semiconductor device of the third embodiment is off.

FIG. 6(b) shows an energy band when the semiconductor device of the third embodiment is on.

BEST MODE FOR CARRYING OUT THE INVENTION

First, important characteristics of the embodiments will be noted. It is preferred that an III-V semiconductor is a gallium nitride (GaN) compound semiconductor device. Since a band gap of gallium nitride compound is large, a device capable of high temperature operation can be realized. Since the gallium nitride compound has a high breakdown field, it has the characteristics of high breakdown voltage with high output. Since the gallium nitride compound has a high electron mobility, it has the characteristics of low on-resistance and high frequency operation. The embodiments will be described in detail with reference to the figures.

First Embodiment

Figure 1:
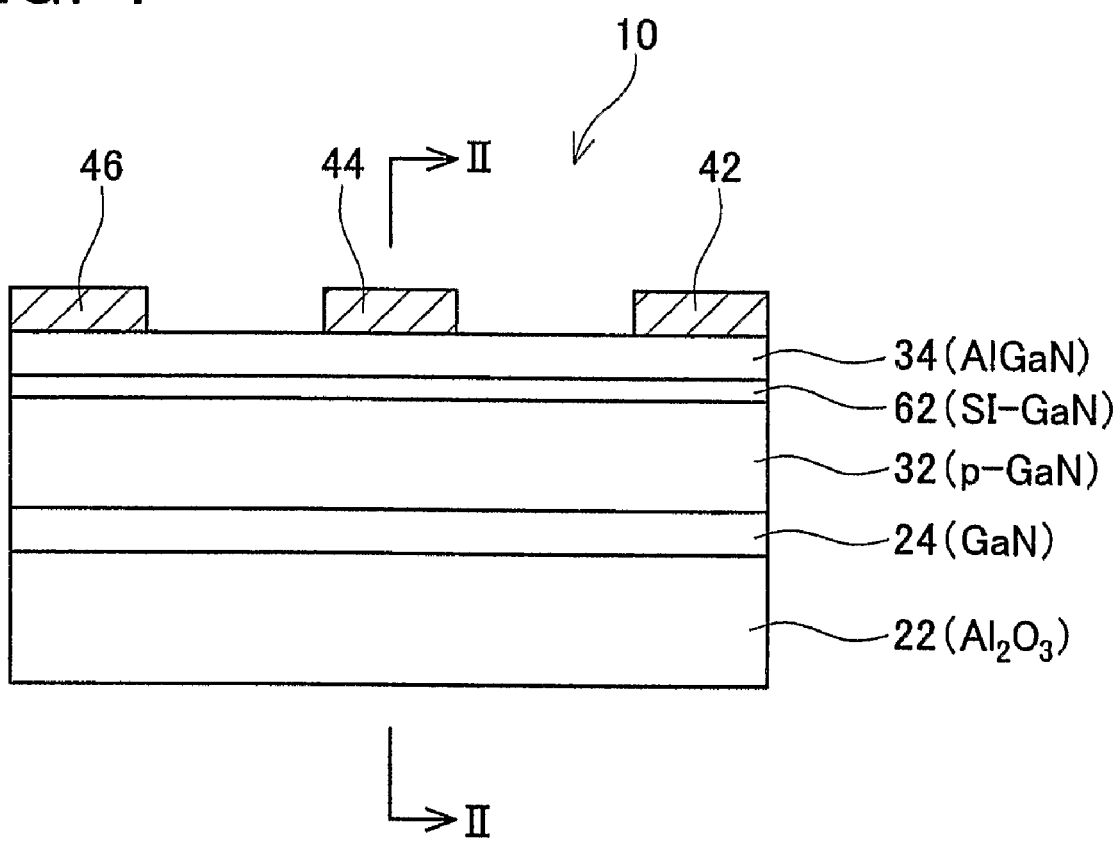
FIG. 1 shows a cross-sectional view of essential parts of a semiconductor device of a first embodiment.

FIG. 1 schematically shows a cross-sectional view of essential parts of a semiconductor device 10 of the first embodiment.

The semiconductor device 10 comprises a substrate 22 formed from sapphire ($Al_2O_3$) at the bottom side. Instead of sapphire, silicon carbide (SiC), gallium nitride (GaN), etc. may be used to form the substrate 22. A buffer layer 24 formed from gallium nitride (GaN) is formed on the substrate 22. A p-GaN layer 32 (an example of a first layer), an SI (Semi Insulated)-GaN layer 62 (an example of a middle layer), and an AlGaN layer 34 (an example of a second layer), are stacked on the buffer layer 24.

The SI-GaN layer 62 is located between the p-GaN layer 32 and the AlGaN layer 34. The p-GaN layer 32 has been doped with magnesium (Mg). Semiconducting crystals of the AlGaN layer 34 contain aluminum (Al), and the AlGaN layer 34 has a wider band gap than the p-GaN layer 32 and the SI-GaN layer 62.

A gate electrode 44 (an example of an electrode) formed from a stacked structure of nickel (Ni) and gold (Au) is located at a center, relative to the page, of a top surface of the AlGaN layer 34. The gate electrode 44 directly contacts with the top surface of the AlGaN layer 34, and forms a Schottky contact with the AlGaN layer 34. A drain electrode 42 and a source electrode 46, both formed from a stacked structure of titanium (Ti) and aluminum (Al), are disposed at left and right sides relative to the page, with the gate electrode 44 being located between the two. The drain electrode 42 and the source electrode 46 make ohmic contact with the top surface of the AlGaN layer 34. The SI-GaN layer 62 is essentially formed from an intrinsic type semiconductor layer.

Figure 2:
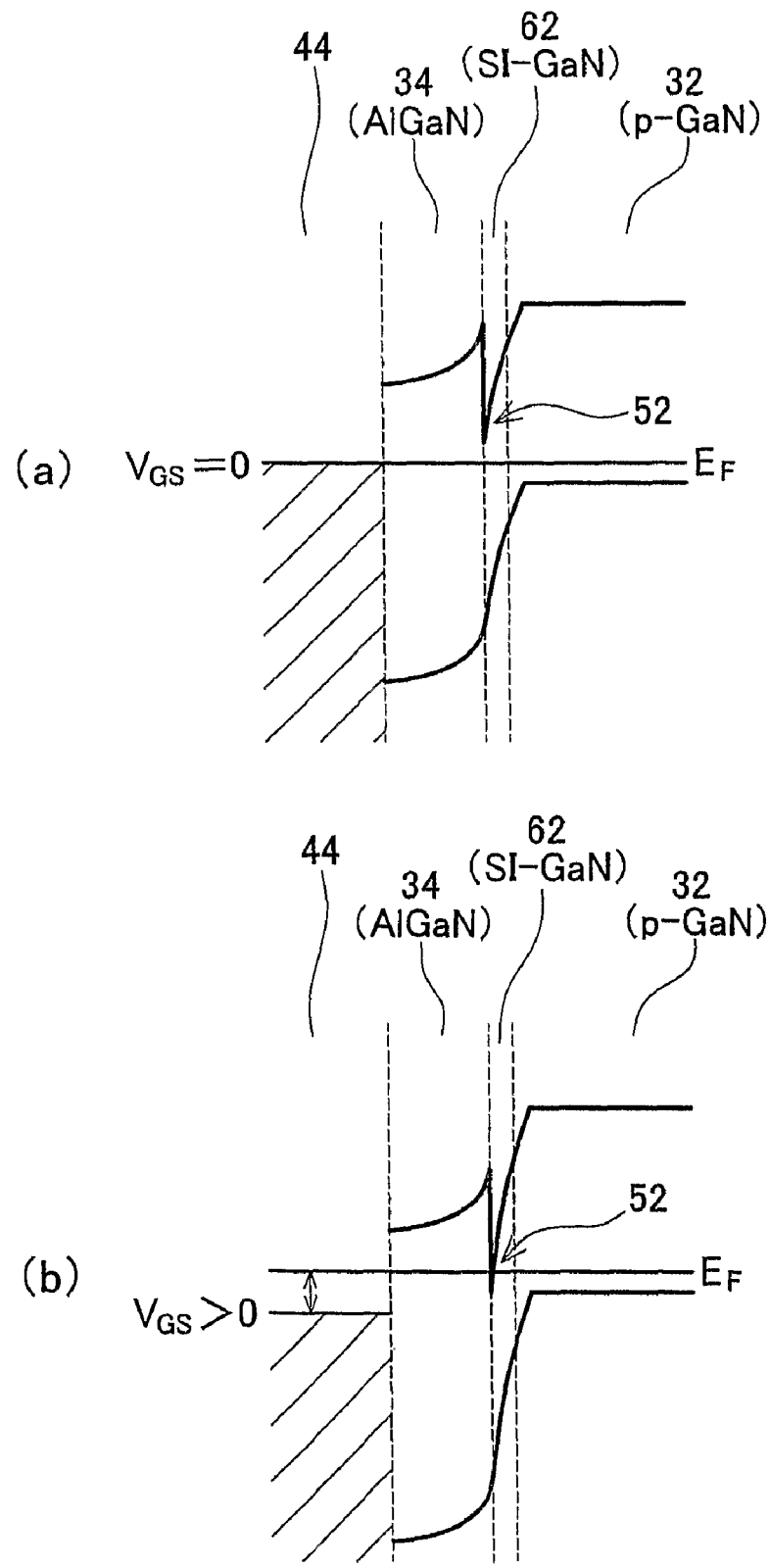

Next, the operation of the semiconductor device 10 will be described with reference to the figures showing the energy bands. FIG. 2 shows energy bands along the line II-II of FIG. 1. The numbers shown in the energy bands correspond to the numbers of each layer in FIG. 1.

FIG. 2(a) shows a state where voltage is not being applied to the gate electrode 44, and FIG. 2(b) shows a state where positive voltage is being applied to the gate electrode 44.

As shown in FIG. 2(a), the band gap of the AlGaN layer 34 is wider than the band gap of the p-GaN layer 32 and the SI-GaN layer 62. On the basis of this difference in band gap, a potential well 52 is formed at an SI-GaN layer 62 side of a junction between the AlGaN layer 34 and the SI-GaN layer 62. The energy level of a conduction band of the potential well 52 is above the Fermi level ($E_F$) when the gate electrode 44 is 0V. Consequently, 2DEG is not generated in the potential well 52. As a result, there is no current flow between the drain electrode 42 and the source electrode 46 of the semiconductor device 10 when the gate electrode 44 is 0V. That is, the semiconductor device 10 is operating as normally-off.

By contrast, as shown in FIG. 2(b), the energy level of the conduction band of the potential well 52 is below the Fermi level ($E_F$) when positive voltage is applied to the gate electrode 44. Consequently, 2DEG is generated in the potential well 52. Electrons in the 2DEG move two dimensionally along the potential well 52, flowing between the drain electrode 42 and the source electrode 46. The semiconductor device 10 is thus turned on.

At this juncture, the 2DEG electrons flow along the SI-GaN layer 62 that has a lower impurity concentration. As a result, there is a low probability that the electrons will be scattered by impurities. The mobility of the electrons is thus higher, and low on-resistance is obtained.

In the above semiconductor device 10, an insulating layer formed from, for example, silicon oxide ($SiO_2$) may also be provided between the AlGaN layer 34 and the gate electrode 44. When the insulating layer is provided, current can be prevented from flowing from the gate electrode 44 towards the AlGaN layer 34 when positive voltage has been applied to the gate electrode 44. Stable operation can therefore be realized.

It is preferred that the AlGaN layer 34 is doped with silicon (Si) as n-type impurities. If the AlGaN layer 34 is n-type, it functions as an election supply layer. It can consequently supply, when turned on, a large number of electrons towards the two-dimensional electron gas layer. The on-resistance of the semiconductor device 10 can consequently be reduced further. However, the AlGaN layer 34 may instead be another type, such as SI (Semi Insulated), as long as it is not p-type.

Next, the manufacturing method of the semiconductor device 10 will be described with reference to FIG. 1.

First, the sapphire substrate 22 is prepared. The low temperature organometallic vapor phase epitaxy method (hereafter referred to as MOCVD method) is used to form the buffer layer 24 on the sapphire substrate 22. The buffer layer 24 has a thickness of approximately 50 nm. At this juncture, trimethylgallium (TMGa) is favorable as a raw material for the gallium, and ammonia gas ($NH_3$) is favorable as a raw material for the nitrogen.

Next, the MOCVD method is used to form the p-GaN layer 32 on the buffer layer 24. The p-GaN layer 32 has a thickness of approximately 0.5 μm. At this juncture, trimethylgallium (TMGa) is favorable as a raw material for the gallium, ammonia gas ($NH_3$) is favorable as a raw material for the nitrogen, and cyclopentadienyl magnesium (CP2Mg) is favorable as a dopant.

Next, the MOCVD method is used to form the SI-GaN layer 62 on the p-GaN layer 32. The SI-GaN layer 62 has a thickness of approximately 10 nm (preferably 5~15 nm). At this juncture, trimethylgallium (TMGa) is favorable as a raw material for the gallium, and ammonia gas ($NH_3$) is favorable as a raw material for the nitrogen.

It is preferred that the carriers concentration in the SI-GaN layer 62 is less than $1 \times 10^{17}$ $cm^{-3}$. A semiconductor device with markedly reduced on-resistance can thus be obtained. Furthermore, it is preferred that the thickness of the SI-GaN layer 62 is equal to or narrower than the width of the potential well that is formed. The width of the potential well varies in accordance with the materials used, but is generally in the range of 5~15 nm. It is therefore preferred that the thickness of the SI-GaN layer 62 is adjusted to be in the range of 5~15 nm.

Next, the MOCVD method is used to form the AlGaN layer 34 on the SI-GaN layer 62. The AlGaN layer 34 has a thickness of approximately 25 nm. At this juncture, trimethylaluminum (TMAl) is favorable as a raw material for the aluminum, trimethylgallium (TMGa) is favorable as a raw material for the gallium, and ammonia gas ($NH_3$) is favorable as a raw material for the nitrogen. Moreover, the AlGaN layer 34 may be doped with n-type impurities during its formation using monosilane ($SiH_4$) as the n-type impurities.

Next, the process of forming the electrodes at the top surface side of the AlGaN layer 34 will be described.

First, titanium (Ti) and aluminum (Al) are vapor deposited in sequence on the AlGaN layer 34. The lithography method and the etching method are then used to perform patterning of the drain electrode 42 and the source electrode 46. After patterning has been performed, heat treatment is performed at 550° C. for 30 seconds using the RTA (Rapid Thermal Anneal) method. The contact resistance of the drain electrode 42 and the source electrode 46 with respect to the AlGaN layer 34 is thus reduced, and ohmic contact is realized.

Next, the gate electrode 44 is formed using the lift-off method. That is, a resist film is formed on areas other than where the gate electrode 44 is desired, and then nickel (Ni) and gold (Au) are vapor deposited in sequence. The resist film is then lifted off, removing the nickel (Ni) and gold (Au) formed on the resist film. The gate electrode 44 is thus formed with the desired positional relationship.

The semiconductor device of the first embodiment can be formed by means of the above processes.

With the aforementioned manufacturing method, there is a difference between the band gap in the p-GaN layer 32 and the band gap in the SI-GaN layer 62. There is no distortion generated due to lattice unconformity within the p-GaN layer 32 and the SI-GaN layer 62. Since the SI-GaN layer 62 is formed with a clean crystal structure, there is a higher mobility of the 2DEG electrons along the SI-GaN layer 62. A semiconductor device with markedly reduced on-resistance is therefore realized.

Second Embodiment

Figure 3:
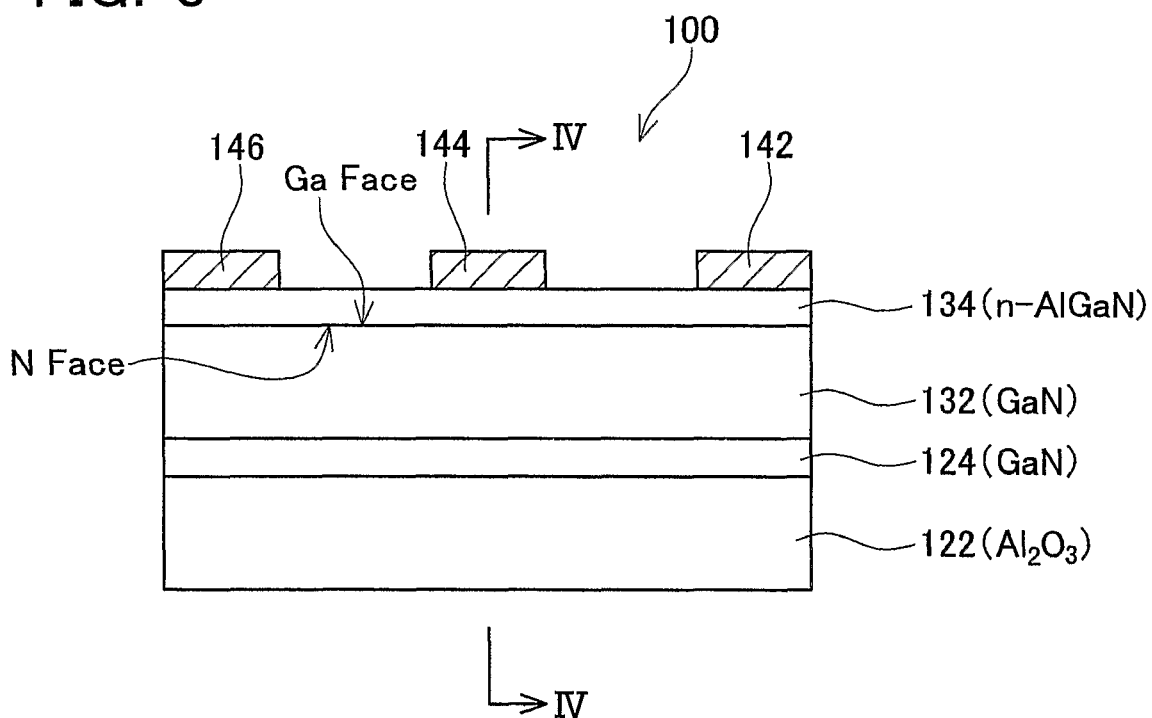
FIG. 3 shows a cross-sectional view of essential parts of a semiconductor device of a second embodiment.

FIG. 3 schematically shows a cross-sectional view of essential parts of a semiconductor device 100.

The semiconductor device 100 comprises a substrate 122 formed from sapphire ($Al_2O_3$) at the bottom side. Instead of sapphire, silicon carbide (SiC) or gallium nitride (GaN) may also be used to form the substrate 122. A buffer layer 124 formed from gallium nitride (GaN) is formed on the substrate 122. A GaN layer 132 (an example of a first layer), and an n-AlGaN layer 134 (an example of a second layer), are stacked on the buffer layer 124.

The n-AlGaN layer 134 has been doped with silicon (Si). Semiconducting crystals of the n-AlGaN layer 134 contain aluminum (Al), and the n-AlGaN layer 134 has a wider band gap than the GaN layer 132.

A gate electrode 144 (an example of an electrode) formed from a stacked structure of nickel (Ni) and gold (Au) is disposed at a center, relative to the page, of a top surface of the n-AlGaN layer 134. The gate electrode 144 directly contacts with the top surface of the n-AlGaN layer 134 and forms a Schottky contact with the top surface of the n-AlGaN layer 134. A drain electrode 142 and a source electrode 146, both formed from a stacked structure of titanium (Ti) and aluminum (Al), are disposed at left and right sides relative to the page, with the gate electrode 144 being located between the two. The drain electrode 142 and the source electrode 146 make ohmic contact with the top surface of the n-AlGaN layer 134.

As shown in FIG. 3, the polarity of the GaN layer 132 at a junction between the GaN layer 132 and the n-AlGaN layer 134 is an N-face (a V group face). As a result, the polarity of the n-AlGaN layer 134 at the junction between the GaN layer 132 and the n-AlGaN layer 134 is a Ga face (an III group face). Consequently, an electric field generated by the spontaneous polarization of the n-AlGaN layer 134 is directed away from the junction (in this example, upwards relative to the plane of the paper).

As is well known, the n-AlGaN layer 134 has a smaller lattices constant than the GaN layer 132, and consequently lattice unconformity generates tensile strain in the n-AlGaN layer 134. An electric field is generated by piezoelectric polarization that is based on this tensile strain. This electric field is generated in the n-AlGaN layer 134 in the opposite direction to the direction of growth. That is, an electric field generated by piezoelectric polarization in the n-AlGaN layer 134 is directed towards the junction (in this example, downwards relative to the plane of the paper). In the second embodiment, the directions of the electric field generated by piezoelectric polarization and of the electric field generated by spontaneous polarization are opposite directions.

The strength of the electric field generated by spontaneous polarization and of the electric field generated by piezoelectric polarization can be varied by varying the concentration of aluminum (Al) in the n-AlGaN layer 134. Normally, the electric field generated by spontaneous polarization is greater than the electric field generated by piezoelectric polarization.

As a result, in a configuration in which the electric field generated by spontaneous polarization is in an opposite direction to the electric field generated by piezoelectric polarization, as in the present embodiment, a total electric field obtained by adding together the two electric fields is in the direction of the electric field generated by spontaneous polarization. That is, the total electric field generated by polarization in the n-AlGaN layer 134 is directed away from the junction (in this example, upwards relative to the plane of the paper).

In conventional semiconductor devices of this type, an electric field generated by spontaneous polarization in a semiconductor layer equivalent to the n-AlGaN layer 134 is directed towards a semiconductor layer located therebelow (equivalent to the GaN layer 132). That is, in the conventional semiconductor devices of this type, the electric field generated by spontaneous polarization and the electric field generated by piezoelectric polarization both have the same direction of polarization and both are generated towards the semiconductor layer equivalent to the GaN layer 132. As a result, the direction of the total electric field (obtained by adding the electric field generated by spontaneous polarization and the electric field generated by piezoelectric polarization) is directed towards the semiconductor layer equivalent to the GaN layer 132. In the conventional semiconductor devices of this type, the electric field generated by spontaneous polarization is directed towards the semiconductor layer equivalent to the GaN layer 132 for the reasons given below.

Firstly, in the conventional semiconductor devices of this type, the MOCVD method was used to form the semiconductor layer equivalent to the GaN layer 132. Such formation will necessarily finish with a Ga face. As a result, the semiconductor layer equivalent to the n-AlGaN layer 134, which is formed thereabove, begins with the formation of an N face. Consequently, the electric field generated by spontaneous polarization will necessarily be directed towards the semiconductor layer equivalent to the GaN layer 132.

Secondly, in conventional technical, it was intended that by aligning the directions of the electric field generated by spontaneous polarization and the electric field generated by piezoelectric polarization, a potential well formed in the vicinity of the junction becomes deeper, and the concentration of 2DEG will thus be increased. For these reasons, the electric field generated by spontaneous polarization was directed towards the semiconductor layer equivalent to the GaN layer 132 in the conventional semiconductor devices of this type.

However, when this type of conventional configuration is adopted, there is a problem that normally-off operation becomes unstable. In the present embodiment, a configuration is adopted in which the direction of the electric field generated by spontaneous polarization and the direction of the electric field generated by piezoelectric polarization differ instead of being in the same direction, as was the case in the conventional configuration. Consequently, a semiconductor device is achieved in which normally-off operation is stable.

Next, the operation of the semiconductor device of the second embodiment will be described with reference to the energy bands in the figures. FIG. 4 shows energy bands along the line IV-IV of FIG. 3. The numbers shown in the energy bands correspond to the numbers of layers in the cross-sectional view of essential parts shown in FIG. 3.

FIG. 4(a) shows a state where voltage is not being applied to the gate electrode 144, and FIG. 4(b) shows a state where positive voltage is being applied to the gate electrode 144.

As shown in FIG. 4(a), the band gap of the n-AlGaN layer 134 is wider than the band gap of the GaN layer 132. As a result, an energy band curves so as to make the Fermi level of the n-AlGaN layer 134 and the Fermi level of the GaN layer 132 equal at a junction between the two layers. In the present embodiment, it is clear that the energy band in the n-AlGaN layer 134 inclines upwards from the gate electrode 144 side towards the junction. This causes an electric field in the n-AlGaN layer 134 to be generated in a direction away from the junction. This suppresses the phenomenon whereby electron carriers are supplied from within the n-AlGaN layer 134 towards the vicinity of the junction. As a result, 2DEG cannot be generated in the vicinity of the junction while the gate electrode 144 is 0V, and consequently there is no current flow between the drain electrode 142 and the source electrode 146 while the gate electrode 144 is 0V. That is, the semiconductor device 100 operates as normally-off.

By contrast, as shown in FIG. 4(b), a potential well 152 is generated while a positive voltage is applied to the gate electrode 144, and the energy level of a conduction band thereof becomes below the Fermi level. Consequently, 2DEG is generated in the potential well 152 while the positive voltage is applied to the gate electrode 144. The 2DEG electrons move two dimensionally within the potential well 152, flowing between the drain electrode 142 and the source electrode 146. The semiconductor device 100 is thus turned on while the positive voltage is applied to the gate electrode 144.

In place of the above configuration, the n-AlGaN layer 134 may be formed from an intrinsic semiconducting layer that contains essentially no impurities.

It is preferred that the GaN layer 132 is formed from a layer with a low concentration of p-type impurities, or from an intrinsic semiconducting layer that contains essentially no impurities. A semiconductor device with low on-resistance can thus be realized.

The manufacturing method of the second embodiment can essentially use the manufacturing techniques of the first embodiment. However, when the GaN layer 132 is formed, it is preferred that, for example, the molecular beam epitaxy (MBE) method is used rather than the organometallic vapor phase epitaxy (MOCVD) method. In the organometallic vapor phase epitaxy (MOCVD) method, as described above, crystal formation finishes with a Ga face. By contrast, when the molecular beam epitaxy (MBE) method is used, manufacturing conditions can be adjusted such that crystal formation finishes with an N face. The semiconductor device 100 of the second embodiment can thus be manufactured.

Third Embodiment

Figure 5:
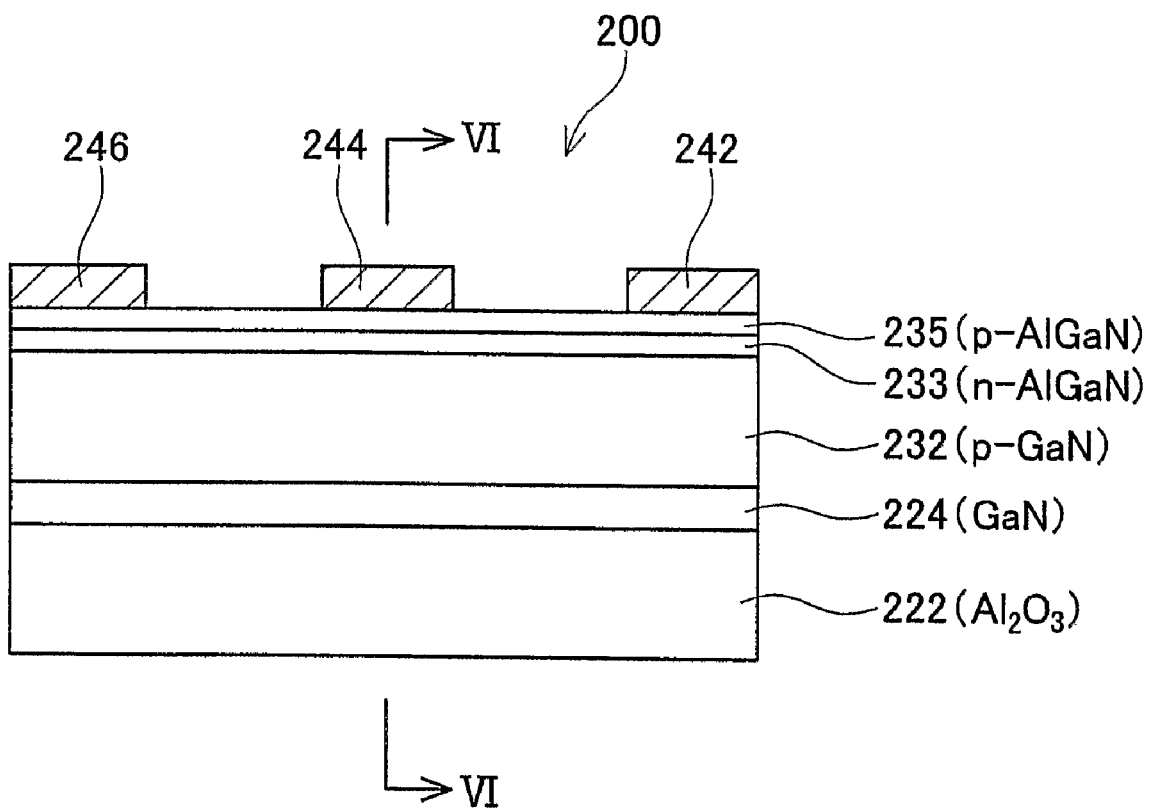
FIG. 5 shows a cross-sectional view of essential parts of a semiconductor device of a third embodiment.

FIG. 5 schematically shows a cross-sectional view of essential parts of a semiconductor device 200 of a third embodiment.

The semiconductor device 200 comprises a substrate 222 formed from sapphire ($Al_2O_3$) at a bottom side. Instead of sapphire, silicon carbide (SiC) or gallium nitride (GaN) may also be used to form the substrate 222. A buffer layer 224 formed from gallium nitride (GaN) is formed on the substrate 222. A p-GaN layer 232 (an example of a first layer), an n-AlGaN layer 233 (an example of a second layer), and a p-AlGaN layer 235 (an example of a surface layer), are stacked on the buffer layer 224.

The p-GaN layer 232 and the p-AlGaN layer 235 have been doped with magnesium (Mg). The n-AlGaN layer 233 has been doped with silicon (Si). Semiconducting crystals of the n-AlGaN layer 233 and the p-AlGaN layer 235 contain aluminum (Al), and the n-AlGaN layer 233 and the p-AlGaN layer 235 have a wider band gap than the p-GaN layer 232.

A gate electrode 244 (an example of an electrode) formed from a stacked structure of nickel (Ni) and gold (Au) is disposed at a center, relative to the page, at a top surface of the p-AlGaN layer 235. The gate electrode 244 is formed directly on the top surface of the p-AlGaN layer 235, and makes a Schottky contact with the p-AlGaN layer 235. A drain electrode 242 and a source electrode 246, both formed from a stacked structure of titanium (Ti) and aluminum (Al), are disposed at left and right sides relative to the page, with the gate electrode 244 being located between the two. The drain electrode 242 and the source electrode 246 make ohmic contact with the top surface of the p-AlGaN layer 235.

Moreover, the p-GaN layer 232 may be formed from an intrinsic semiconducting layer that contains essentially no impurities. In this case, there is a reduced incidence of the 2DEG electrons flowing along this layer being scattered by impurities, and consequently the mobility of the 2DEG is increased.

Figure 6:
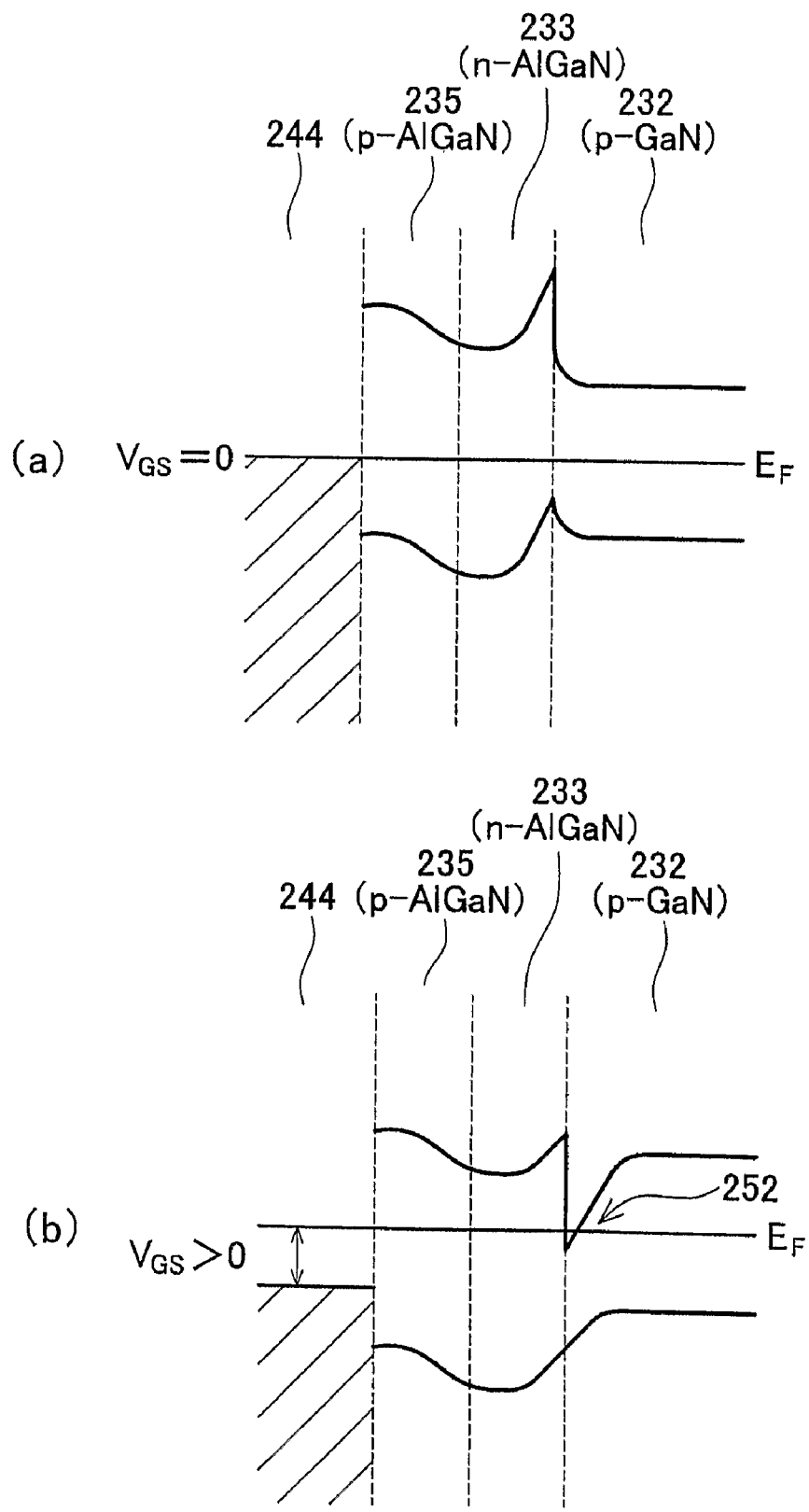

Next, the operation of the semiconductor device 200 of the third embodiment will be described with reference to the energy bands in the figures. FIG. 6 shows energy bands along the line VI-VI of FIG. 5. The numbers shown in the energy bands correspond to the numbers of layers in the cross-sectional view of essential parts shown in FIG. 5.

FIG. 6(a) shows a state where voltage is not being applied to the gate electrode 244, and FIG. 6(b) shows a state where positive voltage is being applied to the gate electrode 244.

As shown in FIG. 6(a), when voltage is not being applied to the gate electrode 244, a depleted layer extends within the n-AlGaN layer 233 from both sides of the p-GaN layer 232 and the p-AlGaN layer 235. As a result, as shown by the energy band in the n-AlGaN layer 233 in FIG. 6 (a), the energy band is inclined, and the energy level of a conduction band is above the Fermi level in the vicinity of a junction between the p-GaN layer 232 and the n-AlGaN layer 233. Consequently, 2DEG cannot be generated in the vicinity of the junction. As a result, there is no current flow between the drain electrode 242 and the source electrode 246 of the semiconductor device 200 when the gate electrode 44 is 0V. That is, the semiconductor device 200 operates as normally-off.

By contrast, as shown in FIG. 6(b), a potential well 252 is generated while a positive voltage is applied to the gate electrode 244, and the energy level of a conduction band in the vicinity of the junction between the p-GaN layer 232 and the n-AlGaN layer 233 becomes below the Fermi level. Consequently, 2DEG is generated in the potential well 252. The 2DEG electrons move two dimensionally within the potential well 252, flowing between the drain electrode 242 and the source electrode 246. The semiconductor device 200 is thus turned on while the positive voltage is applied to the gate electrode 244.

In the semiconductor device 200 of the present embodiment, the n-AlGaN layer 233 and the p-AlGaN layer 235 are adjacent, and consequently the n-AlGaN layer 233 and the p-AlGaN layer 235 are depleted. The potential well formed by the p-GaN layer 232 and the n-AlGaN layer 233 is consequently above the Fermi level, and extremely stable normally-off operation is realized.

In order to substantially deplete the n-AlGaN layer 233 fully, it is preferred that the n-AlGaN layer 233 and the p-AlGaN layer 235 fulfill the following relational expressions:

$$Xd < (2\epsilon Nd \cdot Vd/(qNa(Na+Nd)))^{1/2} \quad (1)$$

$$Xa < (2\epsilon Na \cdot Vd/(qNd(Na+Nd)))^{1/2} \quad (2)$$

Here, Xd is thickness of the n-AlGaN layer 233, Nd is donor density of the n-AlGaN layer 233, Xa is thickness of the p-AlGaN layer 235, Na is acceptor density of the p-AlGaN layer 235, Vd is diffusion potential formed by the n-AlGaN layer 233 and the p-AlGaN layer 235, $\epsilon$ is permittivity of the GaN semiconducting crystal, and q is absolute value of the electron charge.

Figure 7:
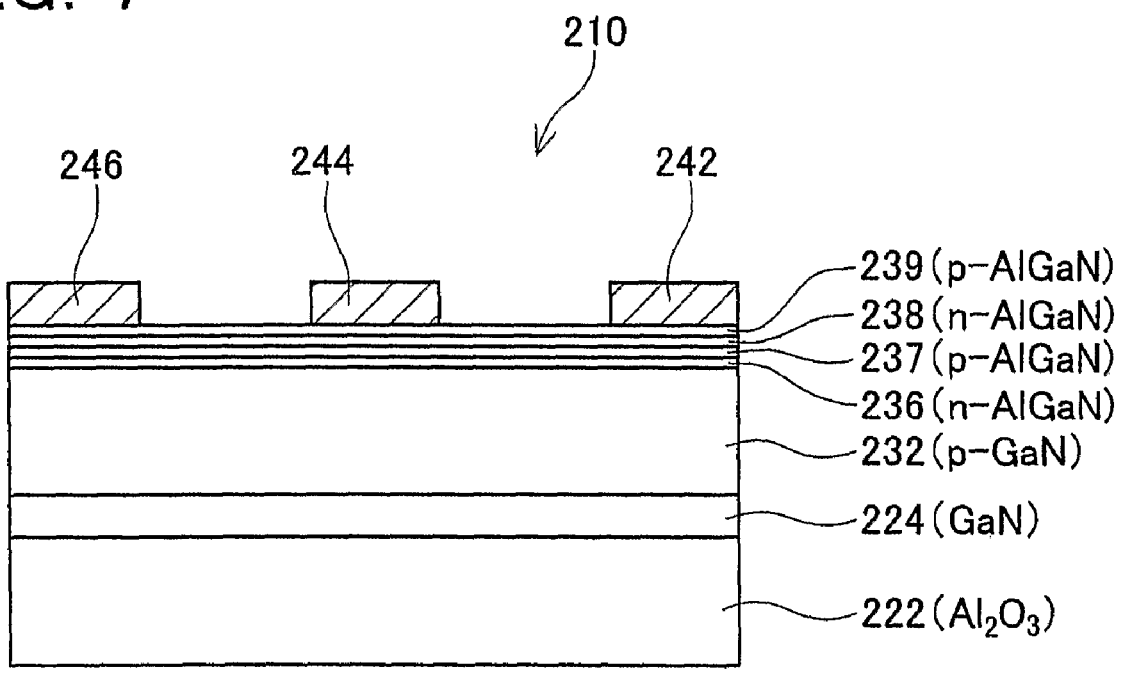
FIG. 7 shows a cross-sectional view of essential parts of a variant of the third embodiment.

Next, a variant of the semiconductor device 200 of the third embodiment will be described. FIG. 7 schematically shows a cross-sectional view of essential parts of a variant semiconductor device 210. Compositional elements identical with the third embodiment have the same reference numbers assigned thereto and a description thereof is omitted.

The characteristic feature of the present variant can be understood clearly when compared with the semiconductor device 200 of FIG. 5. In the semiconductor device 210, there is a repetition of unit of layers equivalent to the n-AlGaN layer 233 (an example of a second layer) and the p-AlGaN layer 235 (an example of a surface layer) of the semiconductor device 200 of the third embodiment. The equivalents of the n-AlGaN layer 233 of the semiconductor device 200 are n-AlGaN layers 236 and 238 (examples of a second layer), and the equivalents of the p-AlGaN layer 235 are p-AlGaN layers 237 and 239 (upper layers). The semiconductor device 210 comprises the first n-AlGaN layer 236, the first p-AlGaN layer 237 stacked thereon, the second n-AlGaN layer 238 stacked thereon, and the second p-AlGaN layer 239 stacked thereon. The combination of the first n-AlGaN layer 236 and the first p-AlGaN layer 237 stacked thereon forms a first unit of layers. The combination of the second n-AlGaN layer 238 and the second p-AlGaN layer 239 stacked thereon forms a second unit of layers. The second unit of layers is stacked on the first unit of layers.

The use of a stacked structure of units of layers, such as the semiconductor device 210, essentially hastens the depletion of the n-AlGaN layer 236 and the n-AlGaN layer 238, which are equivalent to electron supply layers. It is consequently easy to realize stable normally-off operation.

In addition to realizing normally-off operation, it is possible to have a configuration with a comparatively high impurity concentration in the first n-AlGaN layer 236 and the second n-AlGaN layer 238. Electron supply capacity can therefore increase, and on-resistance can be reduced.

Moreover, with the use of a stacked structure, there is reverse bias of pn junctions within the stacked structure even when a positive voltage is applied to the gate electrode 244, and consequently the flow of current from the gate electrode 244 can be prevented. The operation of the semiconductor device 210 is therefore extremely stable.

The manufacturing method of the semiconductor device of the third embodiment can essentially be realized using the manufacturing technique of the embodiment described above.

The embodiments described above merely illustrate some possibilities of the invention and do not restrict the claims thereof. The art set forth in the claims encompasses various transformations and modifications to the embodiments described above.

Furthermore, the technical elements disclosed in the present specification or figures may be utilized separately or in all types of conjunctions and are not limited to the conjunctions set forth in the claims at the time of filing the application. Furthermore, the art disclosed in the present specification or figures may be utilized to simultaneously achieve a plurality of aims or to achieve at least one of these aims.

The invention claimed is:

1. A transistor comprising:
a first layer;
a second layer stacked on a top surface of the first layer; and
an electrode formed at a top surface side of the second layer;
wherein the first layer comprises a first III-V nitride semiconductor,
the second layer comprises a second III-V nitride semiconductor,
a band gap of the second III-V nitride semiconductor is wider than a band gap of the first III-V nitride semiconductor, and
the first layer has an N face at a junction between the first layer and the second layer, and
the second layer has a Ga face at the junction,
wherein an electric field generated by piezoelectric polarization in the second layer has a direction opposite to a direction of an electric field generated by spontaneous polarization in the second layer,
wherein opposite directions of the electric field generated by piezoelectric polarization in the second layer and the electric field generated by spontaneous polarization in the second layer allow for suppression of electrons between the first layer and the second layer when voltage is not applied to the electrode.

2. The transistor as defined in claim 1, wherein the electric field generated by piezoelectric polarization in the second layer is generated from tensile strain of lattice unconformities between the first layer and the second layer.

3. The transistor as defined in claim 1, wherein the direction of the electric field generated by polarization in the second layer extends from the junction between the first layer and the second layer.

4. The transistor as defined in claim 1, wherein the first layer has a first conductivity type or a substantially semi-insulating type, and the second layer has a second conductivity type.

* * * * *